United States Patent [19]

Yamada et al.

[11] Patent Number: 4,589,003

[45] Date of Patent: May 13, 1986

[54] SOLID STATE IMAGE SENSOR COMPRISING PHOTOELECTRIC CONVERTING FILM AND READING-OUT TRANSISTOR

[75] Inventors: Hidetoshi Yamada, Tokyo; Atsushi Yusa, Ina; Takashi Mizusaki, Hamamatsu; Jun-ichi Nishizawa, Sendai, all of Japan

[73] Assignee: Olympus Optical Co., Ltd., Tokyo, Japan

[21] Appl. No.: 555,987

[22] Filed: Nov. 29, 1983

[30] Foreign Application Priority Data

Dec. 14, 1982 [JP] Japan ............................. 57-217719

[51] Int. Cl.[4] ........................................... H01L 29/80
[52] U.S. Cl. ................................. 357/22; 357/30; 357/31; 357/32; 357/58; 357/41; 357/45; 357/2
[58] Field of Search .................. 357/30, 30 G, 30 H, 357/30 I, 31, 32, 22, 22 E, 41, 45, 2, 58

[56] References Cited

U.S. PATENT DOCUMENTS

| | | | |
|---|---|---|---|
| 4,363,963 | 12/1982 | Ando ............................... | 357/31 X |
| 4,377,817 | 3/1983 | Nishizawa et al. .................. | 357/22 |
| 4,419,604 | 12/1983 | Ishioka et al. ..................... | 357/2 X |
| 4,429,325 | 1/1984 | Takasaki et al. ................... | 357/31 |

OTHER PUBLICATIONS

Physics of Semiconductor Devices, pp. 313, 433, 434, Author—S. M. Sze.

Primary Examiner—Martin H. Edlow
Assistant Examiner—William A. Mintel
Attorney, Agent, or Firm—Parkhurst & Oliff

[57] ABSTRACT

A solid state image sensor including a substrate, an epitaxial layer grown on the substrate, an opaque bottom electrode applied on the epitaxial layer, a photoconductor film deposited on the bottom electrode, a transparent surface electrode applied on the photoconductor film, a reading-out SIT formed in the epitaxial layer and a resetting MOS-FET also formed in the epitaxial layer. A gate diffusion region of the reading-out SIT is connected to the bottom electrode and a source region of resetting MOS-FET is also connected to the bottom electrode. A source electrode connected to the source region of the reading-out SIT is extended under the bottom surface, while an insulating layer is interposed therebetween to form a capacitance. Charge carriers stored in the gate region of the reading-out SIT can be read-out to derive a large output voltage due to the amplifying function of the reading-out SIT.

12 Claims, 11 Drawing Figures

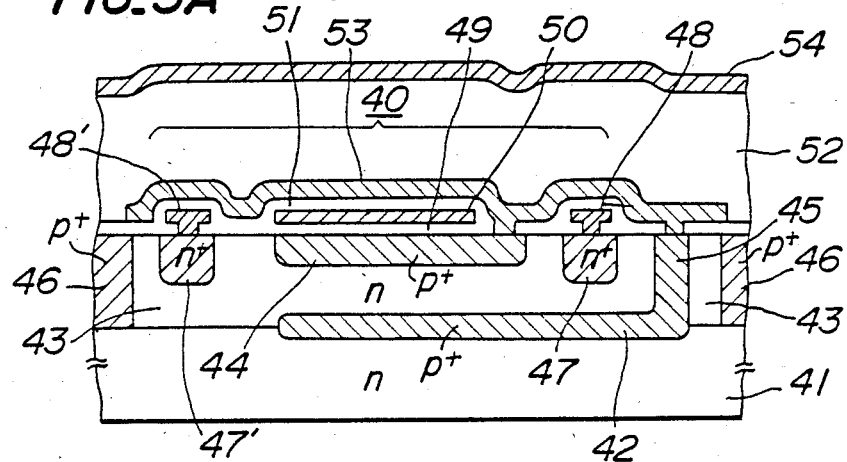
FIG._3A
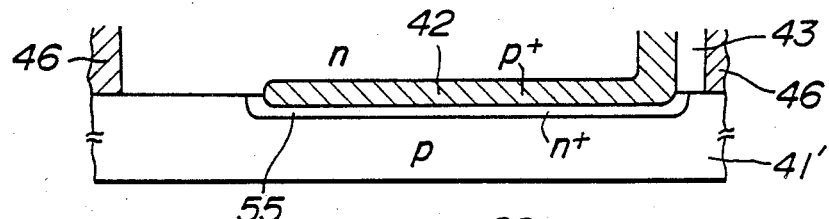
FIG._3B
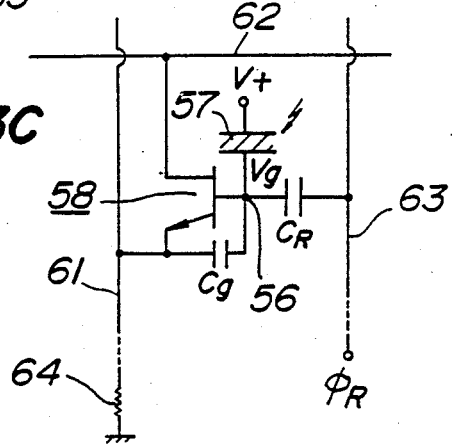
FIG._3C
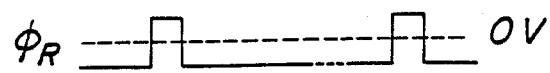
FIG._3D
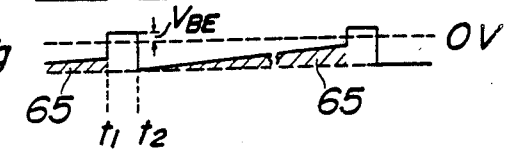
FIG._3E

SOLID STATE IMAGE SENSOR COMPRISING PHOTOELECTRIC CONVERTING FILM AND READING-OUT TRANSISTOR

BACKGROUND OF THE INVENTION

The present invention relates to a solid state image sensor comprising a semiconductor body, an opaque bottom electrode applied on a main surface of the semiconductor body, a photoelectric converting film applied on the bottom electrode, a transparent surface electrode applied on the photoelectric converting film and a read-out transistor provided in the semiconductor body and having an active region connected to the bottom electrode for reading-out charge carriers induced in said photoelectric converting film in response to an incidence of light input.

The known solid state image sensors can be roughly classified into a MOS type image sensor and a charge transfer type image sensor depending upon the construction of the signal reading-out means. Today, the high integration density and large scale array has been developed and practical solid state image sensors have been manufactured on a commercial basis. In accordance with the high integration density of the solid state image sensor, the ratio of an aperture area to an area of a photoelectric converting section has become smaller and smaller, and as a result of this, signal detection with high sensitivity has become difficult to attain.

In order to increase the aperture ratio of the solid state image sensor there has been recently proposed a solid state image sensor having a so-called layered-construction, in which the photoelectric converting section is provided on the signal reading-out switch or the signal reading-out transfer section. An example of such a solid state image sensor is described in "Technical Report of Japan Television Society", Vol. 3, No. 33, 1980, January, pp. 41 to 46. A typical example of such a solid state image sensor is shown in FIG. 1.

In FIG. 1, the solid state image sensor comprises a P type substrate 1 and an N channel signal reading-out MOS transistor switch 2 whose source diffusion region 3 is connected to a bottom electrode 5 of a photoconductive film 4. Light input is made incident upon the photoconductive film 4 via a transparent electrode 6 and electron-hole pairs are induced therein. The electrons are absorbed into the transparent electrode 6 and the holes flow into the bottom electrode 5 to increase the potential of the electrode 5, whose potential has been initially set at a low value, e.g. 0 V. It can be considered that the electrons stored in the initial set condition disappear due to their recombination with holes that are conducted into the bottom electrode 5. Then the reading-out can be effected by making the MOS transistor switch 2 conductive to supplement the electrons that have disappeared by means of drain electrode 7, drain diffusion region 8, and the N channel source region 3. That is to say, an electric current due to the supplemental electrons can be derived as a photoelectrically converted output signal.

The most favorable property of this construction is that the bottom electrode 5 can be extended almost to a boundary between adjacent image sensor cells and therefore, the aperture ratio can be made substantially equal to 1. Moreover, the following properties can be obtained.

(1) Since the spectrum sensitivities of the photoconductive films are different from each other in dependence upon their composition, the most preferable photoconductive film can be selected in accordance with a desired characteristics of the image pick-up device to be constructed.

(2) Since the potential of the bottom electrode does not exceed the potential of the transparent electrode even under the strong light input, so-called "blooming" can be inhibited.

(3) Short wavelength components of the incident light input which could not be detected by normal photodetectors, such as a photodiode, can be effectively converted in the surface region of the photoconductive film in the vicinity of the transparent electrode and thus the photoelectric conversion efficiency can be improved.

As explained above, the solid state image sensor of layered-construction has several advantages as compared with other known solid state image sensors, except for possible problems in manufacture. However, when one wishes to increase the integration density of the solid state image sensor and to decrease the size of each of the picture element cells, it will become much more difficult to detect a small signal without decreasing the signal-to-noise ratio. Further, in the case of effecting the image sensing under weak incident light input such as a high shutter speed image sensing, the signal-to-noise ratio is small and the image quality is deteriorated to a great extent. Such problems have been considered to be inevitable both in the solid state image sensor in which the charge carriers induced by photoelectric conversion are supplemented and in the solid state image sensor in which the charge carriers are directly transferred.

SUMMARY OF THE INVENTION

The present invention has for its object to provide a solid state image sensor of charge carrier supplementing type, in which an image signal having a high signal-to-noise ratio can be derived at a high sensitivity.

It is another object of the invention to provide a solid state image sensor in which the aperture ratio can be increased, while the integration density remains high.

According to the invention, a solid state image sensor comprises a semiconductor body or substrate having a main surface, an opaque bottom electrode applied on the main surface of the semiconductor body, a photoelectric converting film applied on the bottom electrode, a transparent surface electrode applied on the photoelectric converting film, a read-out transistor provided in the semiconductor body and having a gate region in ohmic contact with the bottom electrode, and means provided in the semiconductor body for resetting a potential of the said gate region of read-out transistor to a predetermined potential.

BRIEF DESCRIPTION OF THE DRAWINGS

FIG. 3A is a cross sectional view illustrating another embodiment of the solid state image sensor according to the invention; FIG. 3B is a cross sectional view showing a modified embodiment of the solid state image sensor shown in FIG. 3A; FIG. 3C is an equivalent circuit of the solid state image sensor shown in FIG. 3A; and FIGS. 3D and 3E are waveforms for explaining the reset timing of the solid state image sensor illustrated in FIG. 3A.

DESCRIPTION OF THE PREFERRED EMBODIMENTS

Figure 1:
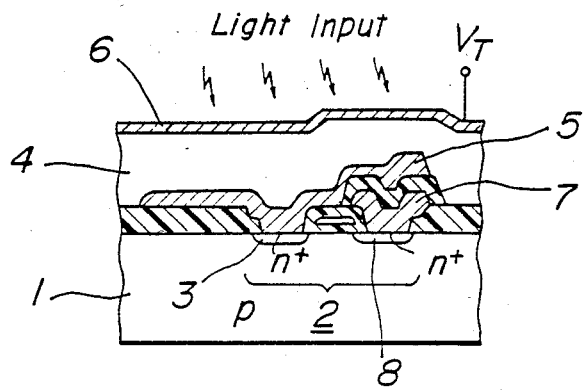
FIG. 1 is a cross sectional view showing an example of a known layered-construction type solid state image sensor.
Figure 2A:
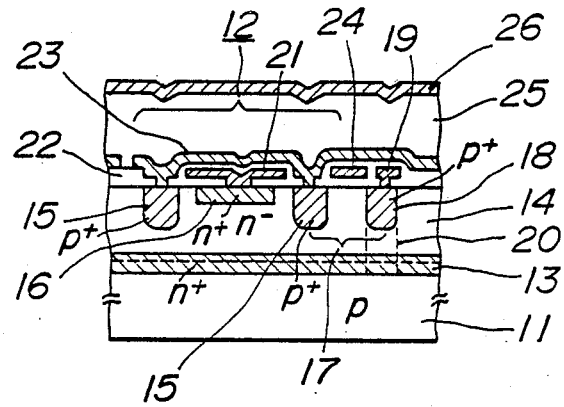
FIGS. 2A and 2B are a cross sectional view and an equivalent circuit, respectively of an embodiment of the solid state image sensor according to the invention.
Figure 2B:
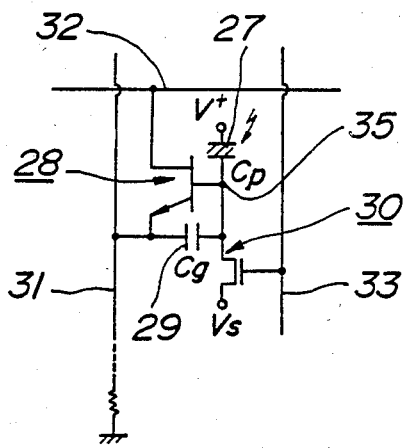

FIG. 2A is a cross sectional view showing a construction of an embodiment of the solid state image sensor according to the invention and FIG. 2B is an equivalent circuit thereof. In the present embodiment, a read-out transistor is formed by an N channel Static Induction Transistor (SIT). It should be noted that the read-out transistor may be formed by a Junction Field Effect Transistor (J-FET). The image sensor comprises a P type substrate 11 and an N+ buried layer 13 serving as a drain of the read-out transistor. On the substrate 11 is grown an N− epitaxial layer 14 having an impurity concentration of about $10^{12}$ to $10^{15}$ atoms/cm$^3$. In the case where the read-out transistor is of the J-FET type, the epitaxial layer 4 may be N type. The broken line shown in the N+ buried layer 13 denotes a boundary between the substrate 11 and epitaxial layer 14. By means of diffusion, in the epitaxial layer 4 are formed a P+ gate diffusion region 15 and an N+ source diffusion region 16 of the read-out transistor 12 and a P+ drain diffusion region 18 of a resetting P channel MOS transistor 17. In this case, in order to improve the characteristics of the read-out transistor 12, it is preferable to have the gate diffusion region 5 surrounding completely the source diffusion region 16.

In a modified embodiment, the P+ drain diffusion region 18 may be extended up to the substrate 11 as shown by broken lines 20. In this case the drain electrode wiring line 19 for applying a drain voltage to the drain region 8 of reset transistor 17 may be omitted. In such a case, a P+ buried region is formed simultaneously with the formation of the N+ buried region 13 and the P+ diffusion region 18 is formed deeply in a separate diffusion step other than that forming the P+ gate region 15. Then the P+ drain layer extending up to the substrate 11 may be provided, due to the outward diffusion of the P+ buried region and the inward diffusion of the P+ drain region 18.

A source electrode wiring line 21 is formed above the source diffusion region 16 and is ohmically contacted with the source region 16 to increase the wiring resistance. The source electrode wiring line 21 has a large area and is opposed to an opaque bottom electrode 23, while an insulating layer 22 is interposed therebetween to form a capacitance. The source electrode wiring line 21 is formed of a polysilicon having impurities doped therein or metal having a high melting point such as tungsten and molybdenum. A gate electrode 24 and the drain electrode wiring line 19 of the reset transistor 17 are formed of similar material. The bottom electrode 23 is made of opaque conductive material such as aluminum. On the bottom electrode 23 is deposited a photoelectric converting film 25. In the present embodiment, the photoelectric converting film 25 is made of photoconductive material such as ZnCdTe, but it may be formed of amorphous semiconductor material such as chalcogenide amorphous and amorphous silicon hydride. On the photoconductor film 25 is applied a transparent electrode 26 formed of SnO$_2$ or indium tin oxide (ITO).

FIG. 2B is an equivalent circuit of the solid state image sensor shown in FIG. 2A. A capacitor 27 represents a photoelectric converting element comprising the transparent electrode 26, photoconductor film 25 and bottom electrode 23, and a transistor 28 represents the reading-out N channel SIT 12 comprising the P+ gate diffusion region 15, N+ source diffusion region 16, N+ buried drain region 13 and N− channel region 14. A capacitor 29 represents a capacitance C$_g$ between the bottom electrode 23 connected to the gate region 15 and source electrode 21. A transistor 30 represents the P channel MOS transistor 17 for resetting the gate potential of the read-out transistor 28 to a constant value V$_s$, with the gate potential being varied in response to the magnitude of the light input. Reference numerals 31 and 32 denote a source electrode wiring line and a drain electrode wiring line of the read-out transistor 28, and the reference numeral 33 indicates a gate electrode wiring line for the reset transistor 30.

As explained above, if the drain region 18 of the resetting transistor 17 is extended up to the substrate 11 and the drain voltage is applied via the substrate, the drain electrode wiring line can be removed. The equivalent circuit shown in FIG. 2B illustrates such a modified embodiment.

Now, the operation of the solid state image sensor shown in FIG. 2A will be explained with reference also made to the equivalent circuit depicted in FIG. 2B. The photoelectric converting element including the photoconductor film 25 is so biased that the potential of the transparent electrode 26 is higher than that of the bottom electrode 23. Upon the incidence of light input, electron-hole pairs are generated in the photoconductor film 25. Electrons are absorbed into the transparent electrode 26 assuming the higher potential, while holes are acclerated by an electric field produced in the photoconductor film 25 and arrive at the bottom electrode 23, so that the potential V$_g$ at a gate point 35 of the read-out transistor 28 is increased. A slope of this increase in the gate potential V$_g$ is determined by a magnitude of the capacitance C$_g$ provided between the gate and source. If the capacitance C$_g$ is large, the gate potential V$_g$ increases gradually, but if the capacitance C$_g$ is small, the gate potential V$_g$ increases abruptly. The magnitude of the capacitance C$_g$ may be suitably selected so as to obtain a desired read-out property. The capacitance C$_g$ mainly consists of the capacitance of the insulating layer 22 between the source electrode 21 and gate electrode, i.e. the bottom electrode 23 and therefore, its magnitude is substantially constant regardless of the potential at the gate point 35. However, in practice, the capacitance of depletion layers formed between the gate diffusion region 15 and the channel region 14 and source diffusion region 16, respectively is added to the capacitance of the insulating layer, and since the depletion capacitance varies non-linearly in dependence upon the applied voltage, the magnitude of the capacitance C$_g$ can not be completely constant. However, in the SIT having the channel region of low impurity concentration, the contribution of the capacitance due to the depletion layer can be ignored. Therefore, the potential at the gate point 35 can be considered to increase in proportion to an amount of electron-hole pairs induced in the photoconductor film 25. In a typical case, the gate potential is initially set to −5 V and is increased to −1 V.

Next, the signal read-out operation will be explained. Upon the signal reading-out, the drain electrode wiring line 32 is selectively biased to a higher voltage such as +12 V and the source electrode wiring line 31 is selectively connected to the earth voltage 0 V via a load resistor 34. Then the current flows through the resistor 34 into the transistor 28 and a voltage across the resistor 34 is read-out as an output voltage. The drain current $I_d$ is determined by the voltage $V_g$ at the gate point 35 and drain voltage $V_d$ and can be expressed by the following equation:

$$I_d = I_o \exp\left[-\frac{q}{kT} \cdot \eta \cdot \left(\left(V_g + \frac{1+\mu}{\mu} \cdot r_s \cdot I_d\right) - \frac{V_d}{\mu}\right)\right]$$

wherein
$\eta$ is a coefficient ($<1$)
$\mu$ is a voltage amplification factor ($>>1$)
$r_s$ is a series resistance from source to specific gate.

According to the description in, "Semiconductor Study", Vol. 15, page 159, for SIT devices, for the large drain current the gate voltage becomes deeper in the reverse direction and the increase in the drain current gradually becomes proportional to the gate voltage. That is to say, when the drain current $I_d$ is large, the following equation can be derived:

$$I_d \simeq \frac{1}{(1+\mu)r_s} \cdot V_d - \frac{1}{(1+\mu)r_s} \cdot V_g$$

In order to effect the linear read-out use may be made of the linear range in which the drain current $I_d$ is large, or use may be made of the non-linear read-out signal is converted into a linear signal.

In case of forming the read-out transistor 28 by the J-FET, in a non-saturated condition for $V_d < (\phi_B - V_g)$ ($\phi_B$ is a gate junction diffusion potential), the drain current $I_d$ can be represented by the following equation:

$$I_d \simeq G_o \left(1 - \sqrt{\frac{8 \cdot k_s \cdot \epsilon_o \cdot (\phi_B - V_g)}{g \cdot N_D \cdot d^2}}\right) V_d$$

wherein $G_o$ is a coefficient and d is the gate spacing. From the above equation, it is understood that the drain current $I_d$ is in proportion to a root of the gate voltage $V_g$. Such a property is quite preferable in case of effecting the image sensing under a wide dynamic range, because the reading-out characteristic is compressed in proportion to the root.

Next another embodiment of the solid state image sensor according to the invention will be explained with reference to FIGS. 3A to 3E. FIG. 3A is a cross sectional view showing the construction of a solid state image sensor, FIG. 3B is a cross sectional view illustrating a modification of a part of the image sensor, FIG. 3C is an equivalent circuit and FIGS. 3D and 3E are waveforms for explaining the resetting operation. In the present embodiment, a read-out transistor 40 is formed by an N channel J-FET. On an N substrate 41 is formed a P+ buried diffusion region 42 which serves as a bottom gate diffusion region of the transistor 40. On the bottom gate diffusion region 42 is deposited an N type epitaxial layer 43. Next, a P+ diffusion region 45 for connecting a P+ surface gate diffusion region 44 and the bottom gate diffusion region 42 to each other is provided and isolation region or P+ diffusion region 46 for isolating picture cells from each other is also provided. Further, in the epitaxial layer 43 are formed source and drain N+ diffusion regions 47 and 47' of the read-out transistor 40, and source electrode wiring line 48 and drain electrode wiring line 48' are formed of polysilicon having impurities doped therein. These wiring lines may be formed of high melting point metals such as molybdenum and tungsten. On the surface gate diffusion region 44 is applied an insulating layer 49 on which an electrode layer 50 is further formed. The electrode layer 50 may be made of polysilicon. On the electrode layer 50 is further applied an insulating layer 51 on which is further formed a bottom electrode layer 53 made an opaque metal such as aluminum. The bottom electrode layer 53 is so formed that it covers all the active regions of the transistor 40 and an ohmic contact is formed between the electrode layer 53 and surface gate diffusion region 44. On the bottom electrode layer 53 is formed a photoelectric converting film 52 made of a photoconductor and a transparent electrode 54 is applied onto the photoconductor film 52.

In order to isolate the adjacent cells effectively by means of the P+ isolation diffusion region 46, the isolation region 46 should be at a floating potential. To this end, a modification shown in FIG. 3B is preferable. That is to say, a P type substrate 41' is prepared and an ohmic contact is formed between the isolation region 46 and substrate 41'. In order to isolate the gate diffusion region 42 from the substrate 41, an N+ diffusion region 55 is formed between the substrate 41' and the gate diffusion region 42. The N+ diffusion region 55 is formed prior to the formation of the gate diffusion region 42.

Now, the operation of the solid state image sensor illustrated in FIG. 3A will be explained with reference to the equivalent circuit shown in FIG. 3C. The operation is substantially the same as that of the previous embodiment except for the resetting operation and therefore, only the different points will be explained. The capacitance at the floating gate point 56 is constituted by the capacitance of the reset electrode 50, insulating layer 51 and gate electrode 53; the capacitance of the reset electrode 50, insulating layer 49 and gate diffusion region 44; and the capacitance between the source diffusion region 47 and gate diffusion regions 42 and 45. The former two capacitances are represented by a capacitance $C_R$ and the last capacitance is denoted by $C_g$. In the equivalent circuit, a reference numeral 57 represents the photoconductive film, 58 the read-out transistor, 61 the source electrode wiring line, 62 the drain electrode wiring line, 63 the reset electrode wiring line, R the reset pulse applied to the reset electrode wiring line 63 and $V_g$ expresses the gate potential.

Upon incidence of the light input, holes are gradually accumulated in the gate electrode 53 and the gate potential $V_g$ is increased as shown by 65 in FIG. 3E. When a bias voltage is applied to the drain and source electrodes, the drain current flows in accordance with the gate potential $V_g$ and an output voltage is produced across a load resistor 64 connected to the source electrode wiring line 61.

Next, the resetting operation will be explained with reference to FIGS. 3D and 3E. At a timing $t_1$, a reset pulse $\phi_R$ is raised to an amplitude $V_R$ which satisfies the following condition:

$$\frac{C_R}{C_R + C_g} \cdot V_R > V_{BE}$$

Then, the gate potential $V_g$ is clamped to $V_{BE}$ with respect to the source potential of 0 V. At a timing $t_2$, the reset pulse $\phi_R$ goes to a negative potential and the gate potential $V_g$ is reset to a negative value.

$$V_{BE} - \frac{C_R}{C_R + C_g} \cdot V_R$$

In this manner, the picture cell is reset to such a condition that the accumulation of the signal charge is allowed.

Upon the incidence of the light input, the gate potential is gradually increased due to the gradual accumulation of holes in the gate region shown by shaded area 65 in FIG. 3E. After the reading-out, the gate potential is reset again to a given constant value. Excessive holes stored in the gate region are conducted away by means of the gate-source junction at the occurrence of the rising edge of the rest pulse $\phi_R$ (time $t_1$).

Figure 4A:
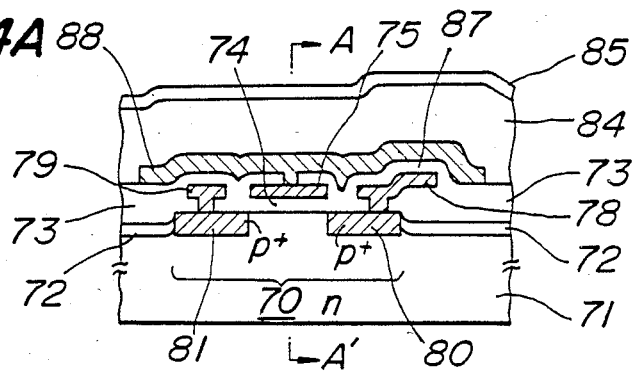
FIG. 4A is a cross sectional view depicting still another embodiment of the solid state image sensor according to the invention.
Figure 4B:
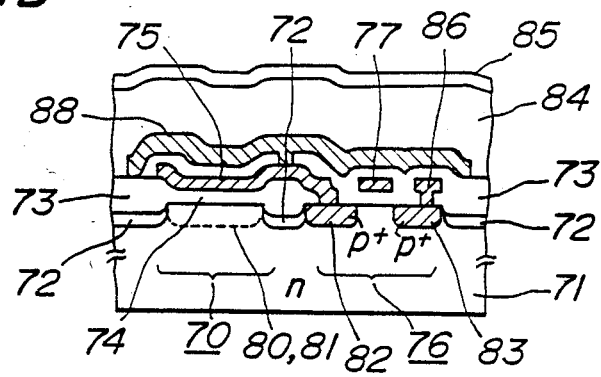
FIG. 4B is a cross sectional view cut along a line A—A' in FIG. 4A.
Figure 4C:
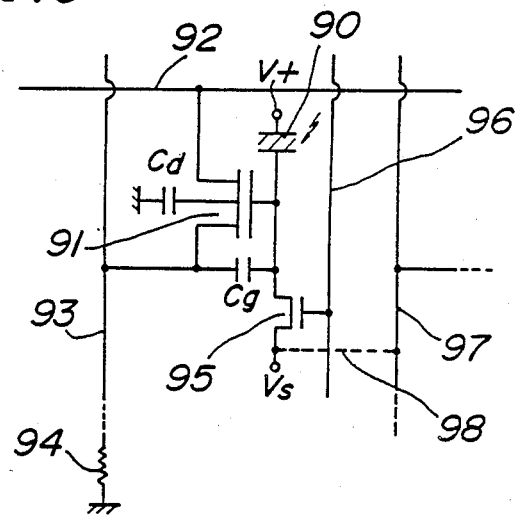
FIG. 4C is an equivalent circuit of the solid state image sensor illustrated in FIG. 4A.

FIG. 4A is a cross sectional view illustrating still another embodiment of the solid state image sensor according to the invention, FIG. 4B is a cross section cut along a line A—A' in FIG. 4A, and FIG. 4C is an equivalent circuit of the image sensor of FIG. 4A. In this embodiment, a reading-out transistor 70 is constituted by an N channel MOS-FET.

The image sensor comprises a P type substrate 71 in which are formed a P+ channel stopper diffusion region 72 and a selective oxidation film 73 (commonly referred to as LOCOS construction). Then a gate oxide layer 74 is grown. Then a gate electrode 75 and a gate electrode 77 of a reset transistor 76 are formed of impurity (−) doped polysilicon or high melting point metals such as molybdenum and tungsten. Further, a source electrode 78 and a drain electrode 79 of the read-out transistor 70 and a drain electrode 86 of the reset transistor 76 are formed. Further an N+ source diffusion region 80 and an N+ drain diffusion region 81 and an N+ source diffusion region 82 and an N+ drain diffusion region 83 of the reset transistor 76 are formed.

Above the gate electrode 75 is formed an opaque bottom electrode 88, while an insulating film 87 is interposed therebetween. On the bottom electrode 88 are successively formed a photoconductor film 84 and a transparent electrode 85.

Now, the operation of the solid state image sensor of the present embodiment will be described also with reference to the equivalent circuit shown in FIG. 4C.

Upon incidence of the light input, holes induced in the photoconductive film 84 are stored in the gate region of the read-out transistor 91 and the gate potential is gradually increased in accordance with a slope which is determined by the capacitance $C_d$ between the gate electrode 75 and substrate 71 and the capacitance $C_g$ between the gate electrode 75 and the source electrode 78 via the insulating layer 87. Upon the reading-out, a drain electrode wiring line 92 is selectively biased and a high voltage is applied to the drain. At the same time, a source electrode wiring line 93 is selected and the source is connected to the earth potential (0 V) via a load resistor 94. When the capacitances $C_g$ and $C_d$ are so determined that the drain voltage $V_d$ and gate voltage $V_g$ vary within such a range that the read-out transistor operates in a non-saturated condition, the drain current $I_d$ can be expressed by the following equation:

$$I_d = \beta\{(V_g - V_T) \cdot V_d - \tfrac{1}{2} V_d^2\}$$

From this equation, it is apparent that the drain current $I_d$ is proportional to the gate potential $V_g$. Therefore, across the load resistor 94 is produced an output voltage proportional to the amount of the light input during the read-out period.

The initial gate potential $V_g$ is set to a value equal to $V_T$ or slightly higher than $V_T$, so that when the light input is zero, the drain current becomes zero or very small. That is to say, after the reading-out by the reset transistor 95, the gate electrode wiring line 96 is selected at a suitable timing to excite the gate and the gate potential is set to the above-mentioned set value $V_s$. The drain electrode wiring line 92 may be deleted, if the drain of the reset transistor 95 is connected to a source electrode wiring line 97 of an adjacent cell as shown by a broken line 98. In such a case the reset transistor 95 will be driven at a timing prior to or after the reading-out operation of the adjacent cell.

As explained above, in the solid state image sensor according to the invention, it is possible to derive the amplified current due to the amplification mechanism of read-out transistor by storing the charge carrier in the gate region of SIT, J-FET or MOS-FET devices. In this case, the various advantages inherent to the layered-construction type solid state image sensor such as the large aperture ratio, increased photoelectric conversion efficiency due to the conversion of short wavelength light, and anti-blooming characteristic can be obtained. Therefore, the solid state image sensor according to the invention can be preferably applied to the image pick-up device for effecting the imaging under low luminance and high shutter speed conditions. Further, the effective sensitivity of the solid state image sensor according to the present invention is very high and, an area of unit picture cell can be made smaller so that the integration density can be increased further. Moreover, since the amplifying function can be adjusted at will, the characteristic of the solid state image sensor can be effectively matched to particular applications.

Particularly, in the case where the read-out transistor is formed of SIT, since the gate potential-drain current characteristic becomes linear in accordance with the increase of the gate potential, an excellent linear characteristic for the image picking-up can be obtained. Moreover, since the dynamic range is so wide, it is possible to effect the image picking-up over an exceedingly wide range from a low luminance to a high luminance. Further, since the channel resistance of SIT is low, a high speed read-out can be attained.

In the case where only the reset gate electrode is provided for resetting the gate potential as shown in FIG. 3A, the construction is made simple and compact, and the integration density can be further increased, because the reset gate region can be formed in superimposition with the read-out transistor.

What is claimed is:

1. A solid state image sensor for sensing radiation incident thereon in a first direction generally perpendicular thereto and producing an output level corresponding to the intensity of the incident radiation, comprising:
- a semiconductor body having a main surface generally perpendicular to said first direction;
- a bottom electrode layer, opaque to said incident radiation, applied on and overlying the main surface of said semiconductor body;
- a photoelectric converting film layer applied on and overlying said bottom electrode layer;
- a surface electrode layer, transparent to said incident radiation, applied on and overlying said photoelectric converting film layer;
- a read-out transistor including drain, gate, and source regions provided in said semiconductor body, said gate region being in ohmic contact with said bottom electrode layer, said read-out transistor being arranged to conduct a source-drain current thereof in said first direction perpendicular to the main surface of said semiconductor body, with one of said source and drain regions providing said output level corresponding to an amplified version of the voltage produced on said bottom electrode layer by the radiation incident on said photoelectric converting film layer; and
- means provided in said semiconductor body for periodically resetting said gate region of said read-out transistor to a predetermined reference potential.

2. A solid state image sensor according to claim 1, wherein said read-out transistor comprises a static induction transistor having a gate region connected to the bottom electrode layer, a source region and a drain region.

3. A solid state image sensor according to claim 2, wherein said resetting means comprises a MOS-FET having a source region connected to the bottom electrode layer, a drain region and a gate region.

4. A solid state image sensor according to claim 3, wherein said semiconductor body comprises a substrate of one conductivity type and an epitaxial layer of a second complementary conductivity type deposited on said substrate, and said drain region of said MOS-FET extends through said epitaxial layer to said substrate.

5. A solid state image sensor according to claim 2, further comprising a source electrode connected to said source region of said static induction transistor, said source electrode being extended under, parallel to, and spaced from said bottom electrode, with an insulating layer being interposed therebetween.

6. A solid state image sensor according to claim 1, wherein said read-out transistor comprises a J-FET having a gate region connected to said bottom electrode layer, a source region and a drain region.

7. A solid state image sensor according to claim 6, wherein said resetting means comprises a reset transistor having a reset gate region connected to said bottom electrode layer and a reset gate electrode provided above said reset gate region, with an insulating layer being interposed therebetween.

8. A solid state image sensor according to claim 7, wherein said gate region of said read-out J-FET is formed by a region buried below the main surface of said body and wherein said reset gate region of said resetting means is formed by a region on the main surface of said semiconductor body.

9. A solid state image sensor according to claim 8, wherein said semiconductor body comprises a substrate of a first conductivity type and an epitaxial layer of a second conductivity type deposited on said substrate and having a boundary between said substrate and said epitaxial layer, said buried gate region of the read-out J-FET being situated at said boundary between said substrate and said epitaxial layer.

10. A solid state image sensor according to claim 9, comprising a further buried region of said first conductivity type situated between said buried gate region and said substrate.

11. A solid state image sensor according to claim 1, wherein said photoelectric converting film is made of photoconductive material.

12. A solid state image sensor according to claim 1, wherein said photoelectric converting film is made of amorphous semiconductor material.

* * * * *